United States Patent
Oda

(10) Patent No.: US 7,768,122 B2
(45) Date of Patent: Aug. 3, 2010

(54) SEMICONDUCTOR PACKAGE

(75) Inventor: Takuya Oda, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 109 days.

(21) Appl. No.: 11/962,224

(22) Filed: Dec. 21, 2007

(65) Prior Publication Data
US 2008/0150065 A1    Jun. 26, 2008

(30) Foreign Application Priority Data
Dec. 25, 2006  (JP) ............................. 2006-347434

(51) Int. Cl.
H01L 23/04    (2006.01)
(52) U.S. Cl. ............... 257/710; 257/706; 257/E23.181
(58) Field of Classification Search ............... 257/704, 257/710, E23.181, 706
See application file for complete search history.

(56) References Cited

U.S. PATENT DOCUMENTS

| | | | | |
|---|---|---|---|---|
| 4,771,365 A | * | 9/1988 | Cichocki et al. | 361/705 |
| 5,907,474 A | * | 5/1999 | Dolbear | 361/705 |
| 6,403,881 B1 | * | 6/2002 | Hughes | 174/559 |
| 6,720,647 B2 | * | 4/2004 | Fukuizumi | 257/704 |
| 6,894,853 B2 | * | 5/2005 | Haskett et al. | 359/894 |
| 2001/0038140 A1 | * | 11/2001 | Karker et al. | 257/666 |
| 2002/0196085 A1 | * | 12/2002 | Nakamata et al. | 330/302 |
| 2004/0080481 A1 | * | 4/2004 | Yamazaki et al. | 345/92 |
| 2004/0080917 A1 | * | 4/2004 | Steddom et al. | 361/748 |
| 2005/0238296 A1 | * | 10/2005 | Oda et al. | 385/92 |

FOREIGN PATENT DOCUMENTS

JP    6-13491    1/1994

* cited by examiner

*Primary Examiner*—Benjamin P Sandvik
(74) *Attorney, Agent, or Firm*—Rankin, Hill & Clark LLP

(57) ABSTRACT

A semiconductor package has a substrate having a first heat transfer path for transferring heat from an optical functional element to a back surface of the substrate, a first heat dissipation unit dissipating the transferred heat therefrom, a second heat transfer path for transferring heat generated in an internal cavity and heat from a window lid itself to a back surface and/or a side surface of the substrate, a second heat dissipation unit dissipating the transferred heat therefrom. The heat transfer paths extend through the substrate and have thermal vias.

15 Claims, 3 Drawing Sheets

SEMICONDUCTOR PACKAGE

BACKGROUND OF THE INVENTION

1. Field of the Invention

The present invention relates to a semiconductor package, and more particularly to a semiconductor package including a window lid in which an optical functional element functioning by light irradiation is mounted on an insulating substrate.

2. Description of Related Art

A semiconductor package which mounts an optical functional element functioning by light irradiation and includes a window lid (a lid body with a window) with which an element mounting surface is covered has received attention recently. One example of this kind of semiconductor package is a DMD (Digital Micromirror Device). Briefly as herein described, the DMD is an MEMS device in which multiple minute mirror surfaces (the so-called micromirror with a size of about 10 μm) are arranged as an optical control element surface. When the optical control element surface is irradiated with light corresponding to an image from a light source (lamp) for video projection through an opening for light transmission, its light is reflected by the optical control element surface and the reflected light can be reproduced on a projection screen as an image. By using the DMD, for example, there can be provided a rear projection television or a data projector of which size is small and is light weight are small while which has high brightness and high resolution.

However, it is necessary to improve heat characteristics in the periphery of the package as improvement in high brightness or other performance advances in these image reproducing apparatus. This is because there are problems that a large amount of heat is generated at the time of using such a semiconductor packages. One problem is heat discharged from an optical control element (DMD chip), and another problem is heat derived from an increase in temperature of the window lid itself (particularly, a glass window) which covers the chip mounting surface of a substrate.

The problem of heat discharged from the DMD chip can be solved by disposing a columnar thermal via inside the substrate as described in, for example, Japanese Patent Unexamined Publication JP-A-06-13491. FIG. 1 shows one example of a heat dissipation method proposed in JP-A-06-13491, and an embedded integrated circuit apparatus illustrated is constructed of a multilayer wiring substrate 101 and a thin film multilayer wiring layer 102 formed integrally with the substrate 101 thereon. Also, an electronic component (for example, an LSI element) 103 is mounted on the thin film multilayer wiring layer 102 through a die pad and an element mounting surface is covered with a metal cap 105. Also, an input-output lead 106 is connected to the multilayer wiring substrate 101. Further, a thermal via (a columnar member constructed of a material with high thermal conductivity (for example, copper)) 104 extends through multilayer wiring substrate 101 in the thickness direction, and heat from the electronic component 103 can be discharged from a heat dissipation fin 107 through this thermal via 104.

The heat derived from an increase in temperature of the window lid itself becomes a problem. In a semiconductor package such as the DMD involving light irradiation at the operation time, measures against the heat discharged from the chip can be taken by the method described in JP-A-06-13491, however it is in the present situation in which an increase in temperature of the window lid itself is not considered although the increase is not negligible. In the future, when the amount of heat of the light with which an optical functional element is irradiated from a light source increases due to high brightness, there is fear of damage or a decrease in performance of the optical functional element due to the increase in temperature of the window lid and it is necessary to take new measures against heat dissipation.

SUMMARY OF THE INVENTION

Therefore, an object of the invention is to provide a structure in which in a semiconductor package such as a DMD including an opening for light transmission in a window lid while an optical functional element functioning by light irradiation is mounted on an insulating substrate, both of (1) heat generated in the optical functional element and (2) heat of the window lid itself with which an element mounting surface is covered can be effectively dissipated to the outside of the semiconductor package.

According to the invention, there is provided a semiconductor package including:

an insulating substrate including an element mounting surface;

an optical functional element which functions by light irradiation and is mounted on the element mounting surface of the insulating substrate; and a window lid which hermetically seals the element mounting surface and includes a light transparent member joined to an opening formed thereon, wherein the insulating substrate includes:
 a first heat transfer path which transfers heat from the optical functional element to a back surface of the insulating substrate;
 a first heat dissipation unit which dissipates the transferred heat by the first transfer path and is attached to an end of the first heat transfer path, the end being exposed from the insulating substrate;
 a second heat transfer path which transfers heat from the window lid to at least either of the back surface and a side surface of the insulating substrate; and
 a second heat dissipation unit which dissipates the transferred heat by the first transfer path and is attached to an end of the second heat transfer path, the end being exposed from the substrate.

According to the invention, as can be seen from the following detailed description, in a semiconductor package in which an optical functional element is mounted on an insulating substrate and also an element mounting surface of the substrate is hermetically sealed with a window lid, heat generated in operation in the optical functional element and heat generated by an increase in temperature of the window lid itself (particularly, window glass) by light irradiation can be dissipated to the outside of the package simultaneously by a compact configuration. Further, the heat accumulated in an internal cavity defined by the substrate and the window lid can together be dissipated effectively. Also, damage to the package or the element, a reduction in a usable life or a decrease in performance of the element conventionally occurring in the mounted optical functional element can be prevented effectively by this good heat dissipation effect.

Since the semiconductor package of the invention can have the good effects as described above, a data projector, a rear projection television and other optical related apparatus with size and weight reduction, high brightness and high resolution can be provided.

DETAILED DESCRIPTION OF THE PREFERRED EMBODIMENTS

A semiconductor package according to the invention can be advantageously implemented in various forms, and the invention will hereinafter be described with reference to a DMD package particularly. In addition, it goes without saying that the invention has an effect satisfactory similarly in semiconductor packages other than the DMD package.

Figure 2:
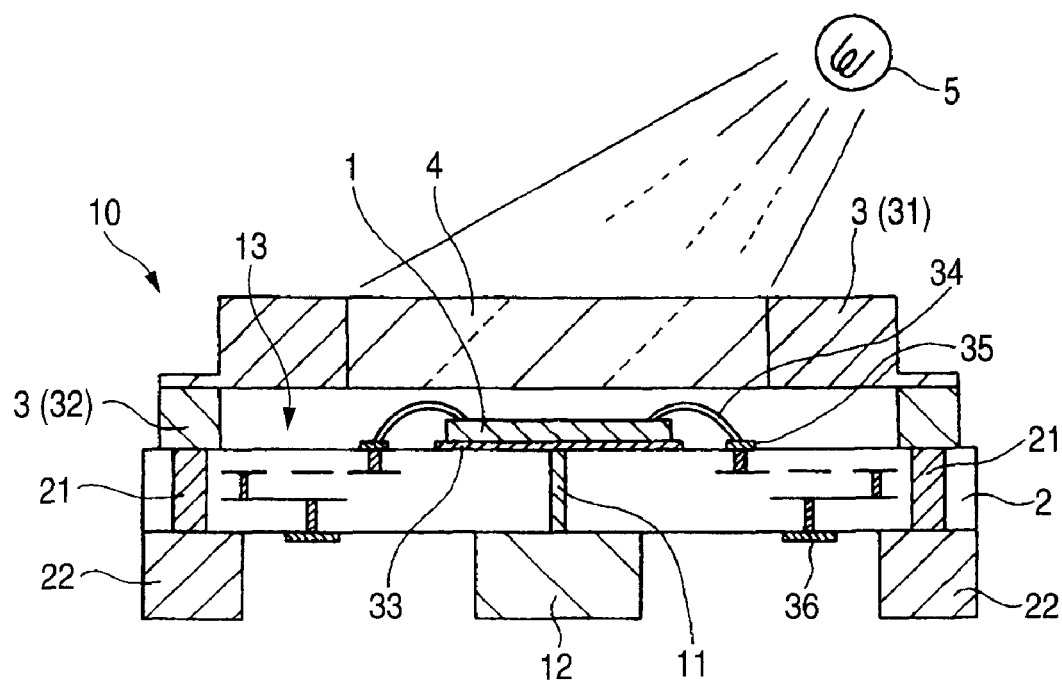
FIG. 2 is a sectional view showing one preferred example of a semiconductor package according to the invention.

FIG. 2 shows a DMD chip 10 which is one example of a semiconductor package according to the invention. In the DMD chip 10, an optical functional element (DMD chip herein) 1 functioning by light irradiation from a light source 5 is mounted on an insulating substrate 2 as shown in the drawing. As the light source 5, various light sources are used according to a type etc. of the DMD chip 10. The typical light source 5 is, for example, a mercury lamp, a halogen lamp, a xenon lamp, a metal halide lamp or an LED.

The insulating substrate 2 is not particularly limited. It is generally preferable to be a ceramic substrate, particularly, a multilayer wiring substrate as normally implemented in this technical field. The illustrated substrate 2 also adopts a form of the multilayer wiring substrate. For simplify the explanation, only a part of the inside of the substrate 2 is illustrated and, for example, wiring layers such as a power source wiring layer or a signal wiring layer are laminated through an interlayer insulating film and pads 35 and 36 are respectively disposed on upper and lower surfaces of the substrate. The wiring layers, the interlayer insulating film, the pads and other component elements incorporated as necessary can be formed respectively using, for example, a well known method in the field of a semiconductor apparatus, and the method is not limited to a specific method. For example, a film of the wiring layer can be formed by sputtering or vacuum deposition of a conductive metal such as copper, gold or aluminum, or an alloy thereof in a predetermined thickness. The interlayer insulating film can be formed of an inorganic material such as aluminum nitride, silicon carbide or alumina, or a polymer organic-material such as polyimide or polyamide-imide. The pad can be formed by plating a metal such as copper, nickel or gold, or an alloy thereof.

The DMD chip 1 is mounted on the insulating substrate 2 through a die pad 33. The die pad 33 can be formed by plating a metal such as copper, nickel or gold, or an alloy thereof in a manner similar to the pad described above. The DMD chip 1 is connected to die pads 35 of the substrate 2 through bonding wires 34 made of, for example, aluminum or gold.

The DMD chip 1 is covered with a window lid (a lid body with a window) 3 in order to protect its DMD chip from vibration, influence, etc. of the outside light. The DMD chip 1 also defines a hermetically sealed internal cavity 13. The window lid 3 includes an opening for transmitting light from the light source 5 and a transparent member 4 is joined to its opening. Here, joining of the window lid 3 to the substrate 2 can be performed using various methods and is generally performed by brazing.

The window lid 3 can have various general configurations in a DMD package, and preferably has a composite structure. For example, the window lid 3 includes a first flat plate-shaped lid part 31 which is equipped with an opening for light transmission (space corresponding to reference numeral 4) and joins the transparent member 4 to the opening for light transmission, and a second frame-shaped lid part 32 which defines the internal cavity 13 and holds the first lid part 31 on the top surface by the peripheral edge and is joined to an element mounting surface of the substrate 2 on the bottom surface as shown in the drawing.

The first lid part 31 and the second frame-shaped lid part 32 are preferably rectangular shapes, respectively, but may have other shapes depending on the DMD package. Also, both the lid parts can be joined using various methods, and is suitable to be joined by, for example, seam weld (resistance fusing) in considering the members being formed of metal or alloy thereof as described below. As other methods, for example, laser fusing can be given.

The window lid can normally be molded in desired shape by molding a metal with good thermal conductivity or an alloy thereof by press molding or other molding methods.

Also, in the case of having the composite structure as described above, the first flat plate-shaped lid part and the second frame-shaped lid part can preferably be separately manufactured from the same material to be incorporated in a subsequent manufacturing step. Materials suitable to form the window lid are not limited to the following materials, but iron (Fe), an iron-nickel (FeNi) alloy, an iron-nickel-cobalt (FeNiCo) alloy, etc. can be given. A material having approximately the same thermal expansion coefficient as that of a transparent member (glass) combined is preferable and generally, an FeNiCo alloy (a thermal expansion coefficient of about $48 \times 10^{-7}/°$ C.) commercially available as "kovar (registered trademark)" is especially useful.

After the window lid (body) is formed, an opening for light transmission (a light transmission hole) through which laser light or other light passes is formed in the upper portion of the window lid. The opening can be formed by, for example, punching. Further, after forming the opening, it is preferable to prevent diffused reflection or stray light from occurring inside the internal cavity by applying a black coating to an inner surface of the window lid (body). The black coating can be formed by, for example, Sn—Ni plating or Zn—Ni plating, and other coatings or surface treatment may be used as necessary.

The transparent member 4 is joined to the light transmission opening of the window lid 3 as shown in the drawing. The transparent member 4 may have a rectangular shape or a circular shape according to a shape of the desired window lid 3, and normally has the rectangular shape. The transparent member 4 is preferably glass and is more preferably glass having approximately the same thermal expansion coefficient as that of the window lid 3. As the preferable glass, for example, hard glass can be given. Other than the glass, the transparent member 4 may be made of heat resisting plastic.

When the transparent member 4 is joined to the light transmission opening, various joining methods can be used, and matched fusing is generally preferable. As necessary, other methods, for example, use of a joining material may be utilized. As the joining material, various kinds of material are commercially available, and the joining material is preferably low-melting glass and is more preferably low-melting glass of lead-free. This is because there is a problem that lead included in the low-melting glass worsens environment. In implementation of the invention, low-melting glass of bismuth (Bi) based can be used particularly advantageously. Generally, after the transparent member 4 is joined, its surface is flattened by polishing and is cleaned.

Other than the matched fusing, the transparent member 4 and the window lid 3 may be joined together by compressing. Further, in a case where the transparent member is made of heat resisting plastic, they can be joined together by bonding.

The DMD chip 10 is characterized by having two kinds of heat dissipation unit, that is, (1) heat dissipation unit for heat from the optical functional element (DMD chip in the illustrated example) and (2) heat dissipation unit for heat from the window lid (particularly, the transparent member) in combination inside the DMD chip.

Referring more specifically to FIG. 2, the heat dissipation unit of the invention includes combination of (1) a first heat transfer path 11 for transferring heat from the optical functional element 1 to a back surface of the substrate 2 and a first heat dissipation unit 12 attached to the end of the heat transfer path 11 exposed from the substrate 2 to dissipates the transferred heat therefrom, and (2) a second heat transfer path 21 for transferring heat from the window lid 3 of the semiconductor package 10 to a back surface and (or) a side surface of the substrate 2 and a second heat dissipation unit 22 attached to the end of the heat transfer path 21 exposed from the substrate 2 to dissipates the transferred heat therefrom.

It is preferable to respectively form the first and second heat transfer paths 11 and 21 so as to be positioned directly under the optical functional element 1 and directly under the window lid 3 (32) in order to increase a heat dissipation effect and simplify the configuration.

Figure 1:
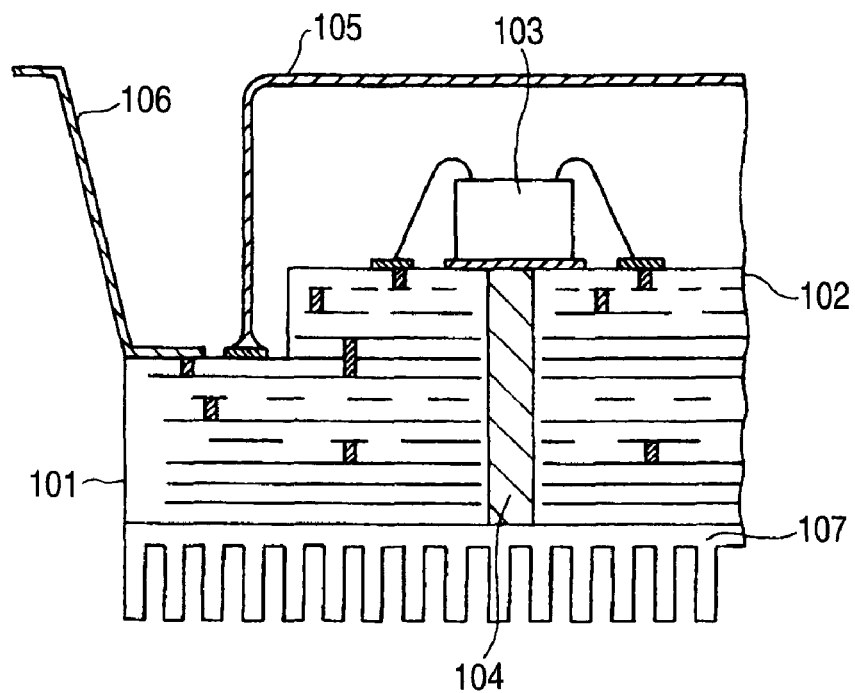
FIG. 1 is a sectional view showing one example of a conventional embedded integrated circuit apparatus.

In implementation of the invention, the first heat dissipation unit 12 and the second heat dissipation unit 22 may be respectively the same or different. Further, it is preferable to form the first and second heat dissipation unit 12 and 22 from the same heat dissipation unit in order to miniaturize and simplify the configuration of the package. The proper heat dissipation unit can be various heat dissipation units generally used in the field of manufacture of a semiconductor apparatus. The proper heat dissipation unit is not limited to units listed below, and a heat slag, a heat sink, a heat dissipation fin, etc. can be given. For example, the heat dissipation fin can be constructed as described above with reference to FIG. 1. As necessary, the heat dissipation unit may be replaced with a rotatable fan or a combination of fan with the heat slug or etc.

The heat transfer paths 11 and 21 can be changed arbitrarily in a manner similar to the heat dissipation units 12 and 22. The heat transfer paths 11 and 21 can preferably be formed from a material having a thermal conductivity of 0.34 cal/cm·sec·° C. or more. A typical example of such a material is not limited to materials listed below, and includes metals such as molybdenum (0.34 cal/cm·sec·° C.), tungsten (0.38 cal/cm·sec·° C.), gold (0.71 cal/cm·sec·° C.), silver (1.00 cal/cm·sec·° C.), copper (0.94 cal/cm·sec·° C.) or aluminum (0.57 cal/cm·sec·° C.), or alloys of the metals (the inside of parentheses indicates thermal conductivity). In addition, gold, silver, copper and aluminum can satisfy requirements of the thermal conductivity described above in post-processing after ceramic sintering.

The heat transfer paths 11 and 21 can be formed by various routes inside the substrate 2, and it is generally preferable to construct the paths 11 and 21 by a form of a thermal via extending through the substrate 2 in a direction of the thickness of the substrate 2.

In some cases, while a thermal via 11 completely extends through the substrate 2, a thermal via 21 may completely extend through the substrate 2 or the thermal via 21 may not penetrate the substrate at a predetermined depth. For example, in the case of the thermal via 21 not penetrating, as explained below with FIGS. 4 and 5, the thermal vias 11, 21 may be connected each other in the substrate 2 or the end of the thermal via 21 may be guided to a side surface of the substrate. Besides, in such cases, it is necessary to dispose an additional heat transfer path (e.g. the path 23 in FIG. 4) extending in a lateral direction in addition to the thermal via penetrating in a direction of the thickness of the substrate 2.

As described above, the thermal vias 11 and 12 are preferably made of a thermal conductive material and also, are preferably disposed directly under the optical functional element 1 and directly under an attachment part of the window lid 3 (32) to the substrate 2, respectively. Here, diameters of the thermal vias 11 and 12 may be approximately the same, but the diameter of the thermal via 21 is advantageously larger than the diameter of the thermal via 11 in order to improve heat dissipation efficiency. The diameter of the thermal via 11 is normally about 0.3 to 1.0 mm and also, the diameter of the thermal via 21 is normally about 0.5 to 1.5 mm.

Formation of the thermal vias 11 and 12 can be implemented using various techniques. Normally, after through holes are formed in predetermined positions of the substrate 2 by punching etc., each of the through holes can be filled with a thermal conductive thermal via formation material (for example, molybdenum or tungsten) by printing etc. of a metal paste, electroless plating or electrolytic plating. As other methods for forming the thermal via, for example, laser processing or drilling can be given.

Figure 3:
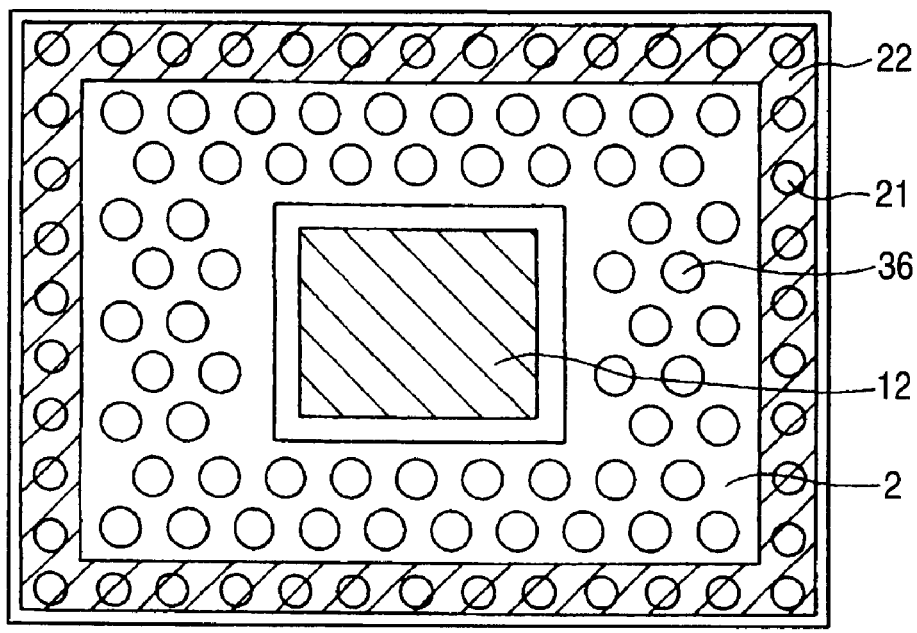
FIG. 3 is a bottom view describing an arrangement state of heat dissipation unit in the semiconductor package shown in FIG. 2.

FIG. 3 is a bottom view describing an arrangement state of the heat dissipation unit 12 and 22 in the DMD package shown in FIG. 2. As can be seen from the view, multiple pads 36 are exposed to the bottom of the substrate 2 and any wiring etc. can be electrically connected to these pads. The heat dissipation unit 12 for the DMD chip is attached to substantially the center of the bottom of the substrate 2. Also, the heat dissipation unit 22 for the window lid is attached to the peripheral edge of the bottom of the substrate 2. In addition, an end face of the thermal via 21 essentially invisible by an obstacle of the heat dissipation unit 22 is shown for ease of understanding of arrangement of the heat dissipation unit 22 in the view. A diameter of the thermal via 21 is about 1 mm and the thermal vias 21 are arranged with intervals of 5 mm. Thus, heat from the window lid can be guided to the heat dissipation unit 22 with a large area through the multiple thermal vias 21, so that good heat dissipation effect and cooling effect can be achieved.

In the DMD package of the invention, combination of the heat dissipation unit can be changed variously.

Figure 4:
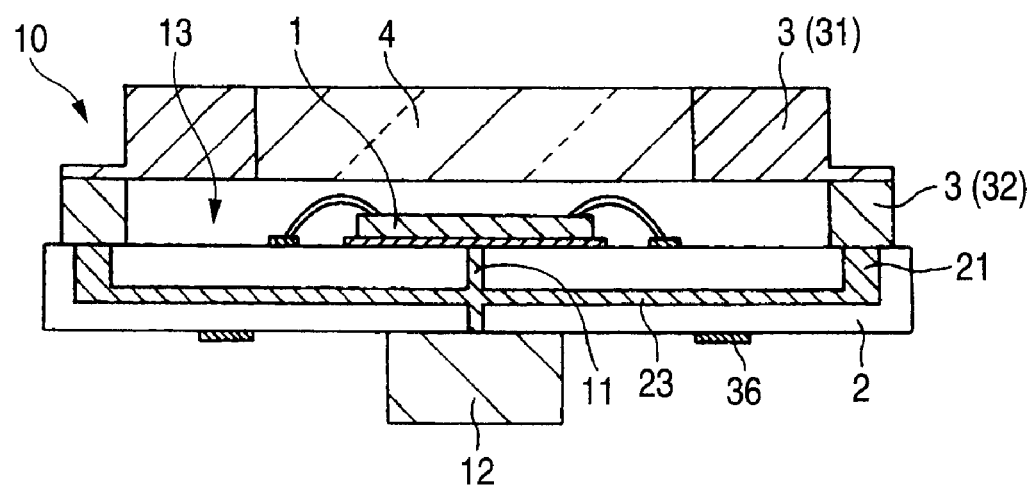
FIG. 4 is a sectional view showing another example of a semiconductor package according to the invention.

For example, heat dissipation unit for a DMD chip 1 and heat dissipation unit 22 for a window lid 3 may be integrated into one body to use only the heat dissipation unit 12 for the DMD chip 1 as shown in FIG. 4 instead of the most typical combination shown in FIG. 2. In this case, a thermal via 21 penetrating in a direction of the thickness of a substrate 2 can be ended at the middle of the substrate to connect its end to a thermal via 11 by an additional heat transfer path 23 extending in a lateral direction. The thermal vias 11 and 21 and the heat transfer path 23 are advantageously formed from the same thermal conductive material in a process, respectively. By being constructed thus, a heat collection effect inside the substrate can be increased.

Figure 5:
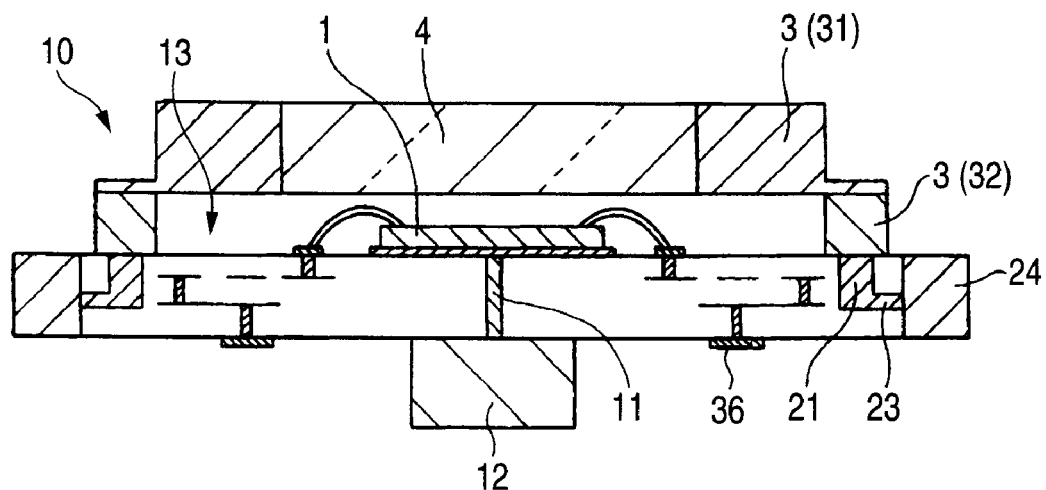
FIG. 5 is a sectional view showing a further example of a semiconductor package according to the invention.

According to an alternative method, as shown in FIG. 5, the ends of thermal vias 21 may be guided to side surfaces of a substrate 2 while forming the same configuration of a thermal via 11 and the heat dissipation unit 12 as the example of FIG. 2. The ends of thermal vias 21 can be connected to the heat dissipation unit 24 attached to the side surfaces of the substrate 2 through additional heat transfer paths 23 extending in a lateral direction as shown in FIG. 5.

Figure 6:
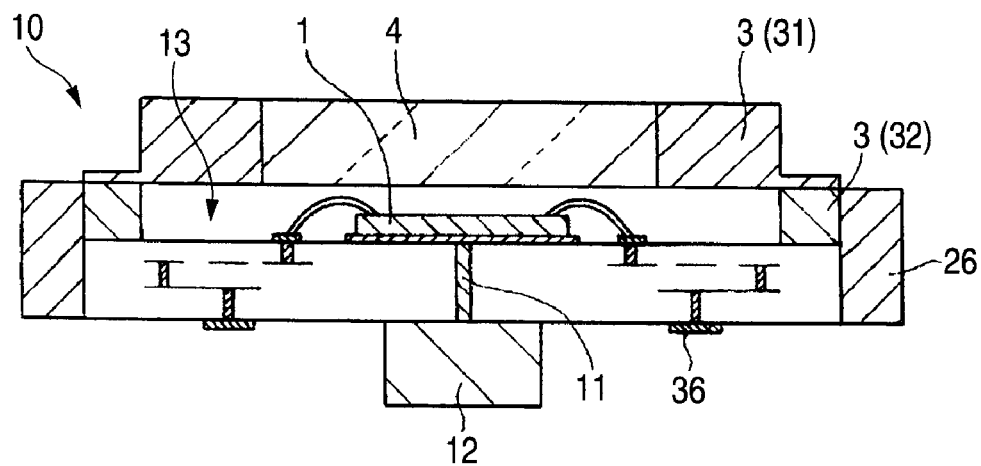
FIG. 6 is a sectional view showing a furthermore example of a semiconductor package according to the invention.

Further, as shown in FIG. 6, the heat dissipation unit 26 may be attached directly to the side surface of the window lid 3. In this embodiment, the heat dissipation unit 26 also functions as the second heat transfer path. Of course, although not shown, a member having good thermal conductivity can be provided between the side surface of the window lid 3 and the heat dissipation unit 26.

As described above, the semiconductor package of the invention can advantageously be used in various forms. A typical example is a DMD package in which an optical functional element is a reflective display element including plural minute mirror surfaces as described above. Also, as another example, a rear projection type liquid crystal package in which an optical functional element is plural reflective liquid crystal elements can be given. As other examples of the semiconductor package, for example, a micro-ribbon array can be given.

EXAMPLE

Subsequently, the invention will be described with reference to the example. In addition, the invention is not limited to the following example.

Example 1

In the present example, a DMD package having the configuration as shown in FIG. 2 was manufactured.

Manufacture of Window Lid:

An iron-nickel-cobalt alloy (a trade name of "kovar (registered trademark)" made by Hitachi Metals, Ltd.) was molded by press and two lid members were manufactured. One lid member is a first flat plate-shaped rectangular lid having an opening for light transmission in substantially the center thereof. Another lid member is a second frame-shaped lid (lid ring) having approximately the same size as that of the first flat plate-shaped rectangular lid.

A light transmission window made of hard glass (borosilicate glass) with a size corresponding to the opening was fitted into the opening of the first lid and matched fusing was performed. In conditions of the matched fusing, the peak temperature was about 1000° C. and total time was about 2 hours. Further, a surface of the fitted glass was polished and Ni/Au plating was performed and then, an AR (anti-reflection) coating was performed.

Manufacture of DMD Unit:

A green sheet of alumina was prepared and a conductive paste made of tungsten (W) was printed on a surface of the sheet by a predetermined pattern and a wiring layer was formed. Then, regions (that is, directly under a DMD chip and directly under a frame-shaped lid of a window lid) in which thermal vias were positioned were selected and through holes were punched in a multilayer wiring substrate. A diameter of the through hole for the DMD chip was about 0.5 mm and then, a diameter of the through hole for the frame-shaped lid was about 1.0 mm. Then, a necessary number of green sheets were overlapped and laminated and a thermal conductive material (molybdenum paste) for the thermal via was printed. Thereafter, a laminated body was sintered. In conditions of the sintering, the peak temperature was about 1500° C. and total time was about 2.5 days. In this manner, the multilayer wiring substrate with the thermal vias was obtained.

For manufacture of the DMD unit, the second frame-shaped lid manufactured in the previous step was first attached. After Ni plating was thinly applied to the multilayer wiring substrate, the second frame-shaped lid was attached by brazing. In conditions of the brazing, the peak temperature was 840° C. and total time was about 2 hours.

After the second frame-shaped lid was attached, a die pad and a bonding pad were formed by Ni plating and Au plating Then, the DMD chip was mounted on the die pad of the multilayer wiring substrate and electrodes of its chip were electrically connected to pads of the same substrate by bonding wires of gold.

Manufacture of DMD Package:

Subsequently, the first lid member was welded on the top surface of the second frame-shaped lid of the DMD unit manufactured as described above by a seam weld method. Finally, heat slugs were respectively attached to the lower end faces of the thermal vias exposed from the substrate. The heat slugs used in the present example were made of aluminum. In this manner, a DMD package including the heat slugs for heat dissipation was completed.

While the invention has been described in connection with the exemplary embodiments, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A semiconductor package comprising:
an insulating substrate comprising an element mounting surface;
an optical functional element which functions by light irradiation and is mounted on the element mounting surface of the insulating substrate; and
a window lid which hermetically seals the element mounting surface and comprises a light transparent member joined to an opening formed thereon, a first flat plate-shaped lid part provided with the opening, and a second frame-shaped lid part which defines an internal cavity of the window lid, wherein the second frame-shaped lid part holds the first lid part by a peripheral edge thereof at a top surface thereof and is joined to the element mounting surface of the substrate on a bottom surface thereof;
wherein the insulating substrate comprises;
a first heat transfer path which transfers heat from the optical functional element to a back surface of the insulating substrate;
a first heat dissipation unit which dissipates the transferred heat by the first transfer path and is attached to the back surface of the insulating substrate and an end of the first heat transfer path, the end being exposed from the insulating substrate;
a second heat transfer path which transfers heat from the window lid to a side surface of the insulating substrate; and
a second heat dissipation unit which dissipates the transferred heat by the second transfer path and is attached to the side surface of the insulating substrate and an end of the second heat transfer path, the end being exposed from the substrate, and
wherein the first and second heat transfer paths comprise respective first and second thermal vias filled with thermal conductive material extending through at least a part of the insulating substrate in a thickness direction, the first thermal via is disposed directly under the optical functional element, and a first portion of the second thermal via extends away from the second frame-shaped lid part of the window lid in the thickness direction of the insulating substrate and a second portion of the second thermal via extends from an end of the first portion of the second thermal via spaced from the second frame-shaped lid part of the window lid to the side surface of the insulating substrate.

2. The semiconductor package as claimed in claim 1, wherein the window lid is made of a material of which thermal expansion coefficient is approximately the same as that of the transparent member.

3. The semiconductor package as claimed in claim 1, wherein
the transparent member is made of glass.

4. The semiconductor package as claimed in claim 1, wherein
the window lid is made of an FeNiCo based alloy.

5. The semiconductor package as claimed in claim 1, wherein
the first and second heat dissipation units are selected from the group consisting of a heat slag, a heat sink and a heat dissipation fin.

6. The semiconductor package as claimed in claim 1, wherein
materials of the first and second heat transfer paths have thermal conductivity equal to or greater than 0.95 cal/cm-sec-° C.

7. The semiconductor package as claimed in claim 1, wherein
material of the first and second heat transfer paths are made of metal selected from the group consisting of molybdenum, tungsten, gold, silver, and aluminum, or an alloy thereof.

8. The semiconductor package as claimed in claim 1, wherein
the semiconductor package is a DMD package.

9. The semiconductor package as claimed in claim 1, wherein
the semiconductor package is a rear projection type liquid crystal package.

10. The semiconductor package as claimed in claim 1, wherein a width of the first thermal via at a contact position with the optical functional element is less than a width of the second thermal via at a contact point with the window lid.

11. A semiconductor package comprising:
an insulating substrate comprising an element mounting surface;
an optical functional element which functions by light irradiation and is mounted on the element mounting surface of the insulating substrate; and
a window lid which hermetically seals the element mounting surface and comprises a light transparent member joined to an opening formed thereon, a first flat plate-shaped lid part provided with the opening, and a second frame-shaped lid part which defines an internal cavity of the window lid, wherein the second frame-shaped lid part holds the first lid part by a peripheral edge thereof at a top surface thereof and is joined to the element mounting surface of the substrate on a bottom surface thereof,
wherein the insulating substrate comprises;
a heat dissipation unit attached to a back surface of the insulating substrate;
a main heat transfer path connected at a first end to the heat dissipation unit;
a first heat transfer path connecting the optical functional element to the main heat transfer path so as to transfer heat from the optical functional element to the heat dissipation unit; and
a second heat transfer path connecting the window lid to the main heat transfer path so as to transfer heat from the window lid to the heat dissipation unit;
wherein the heat dissipation unit dissipates the transferred heat and the main, first, and second heat transfer paths comprise respective main, first, and second thermal vias filled with thermal conductive material extending through at least a part of the insulating substrate in a thickness direction.

12. The semiconductor package as claimed in claim 11, wherein the window lid is made of a material of which thermal expansion coefficient is approximately the same as that of the transparent member.

13. The semiconductor package as claimed in claim 11, wherein
materials of the first and second heat transfer paths have thermal conductivity equal to or greater than 0.95 cal/cm-sec-° C.

14. The semiconductor package as claimed in claim 11, wherein
material of the first and second heat transfer paths are made of metal selected from the group consisting of molybdenum, tungsten, gold, silver, and aluminum, or an alloy thereof.

15. The semiconductor package as claimed in claim 11, wherein a width of the first thermal via is at a contact position with the optical functional element is less than a width of the second thermal via at a contact point with the window lid.

* * * * *